United States Patent [19]

Müller et al.

[11] Patent Number: 5,220,800

[45] Date of Patent: Jun. 22, 1993

[54] NMR MAGNET SYSTEM WITH SUPERCONDUCTING COIL IN A HELIUM BATH

[75] Inventors: Wolfgang H. Müller; Gerhard Roth, both of Karlsruhe; Wolfgang Stautner, Stutensee-Büchig; Peter Turowski; Wolfgang Lehmann, both of Leopoldshafen; Franz Graf, Karlsruhe, all of Fed. Rep. of Germany

[73] Assignees: Bruker Analytische Messtechnik GmbH; Kernforschungszentrum Karlsruhe GmbH, both of Fed. Rep. of Germany

[21] Appl. No.: 806,006

[22] Filed: Dec. 9, 1991

[30] Foreign Application Priority Data

Dec. 10, 1990 [DE] Fed. Rep. of Germany ....... 4039332
Dec. 10, 1990 [DE] Fed. Rep. of Germany ....... 4039365

[51] Int. Cl.$^5$ .................................................. F25B 19/00
[52] U.S. Cl. ........................................ 62/51.3; 335/216; 505/892
[58] Field of Search ............... 62/51.1, 51.3; 335/216; 505/892

[56] References Cited

U.S. PATENT DOCUMENTS 4,689,439  8/1957  Sato ........................................ 62/51.3

FOREIGN PATENT DOCUMENTS 3404600  8/1985  Fed. Rep. of Germany .
3633313  9/1986  Fed. Rep. of Germany .
63-217606  3/1987  Japan .

OTHER PUBLICATIONS

IEEE Transactions on Magnetics, vol. 24, No. 2, Mar. 1988 pp. 1063 to 1066 Turowski et al.
Rev. Sci. Instrum. 52(5), May 1981, pp. 649 to 656 Williams et al.: Magnet system of the 500 MHz spectrometer at the Francis Bitter national Laboratory: I. Design and development of the magnet.
German Book: Technische Physik in Einzeldarstellungen vol. 18 Springer-Verlag, Heidelberg, New York H. Brechna: Superconducting Magnet Systems, pp. 461, 462.

Primary Examiner—Ronald C. Capossela
Attorney, Agent, or Firm—Walter A. Hackler

[57] ABSTRACT

In an NMR magnet system for generating a highly homogeneous magnetic field of high field strength, with at least one superconducting magnet coil which is arranged in a first chamber of a cryostat in supercooled liquid helium at a temperature of less than 4.2K, with the cryostat having at least one further chamber containing liquid helium that is essentially at atmospheric pressure with a temperature of approximately 4.2K, the first chamber is connected to the further chamber in such a way that the supercooled liquid helium located in the first chamber is also essentially at atmospheric pressure. A refrigerator with which the liquid helium can be cooled to a temperature $T \ll 4.2K$, especially to $T \approx 1.8-2.3K$, is provided in the first chamber.

16 Claims, 9 Drawing Sheets

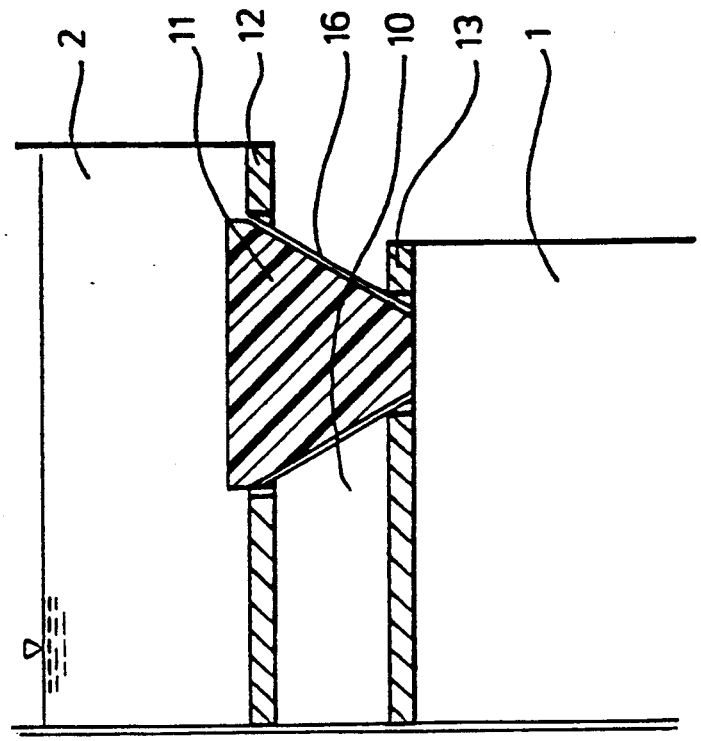
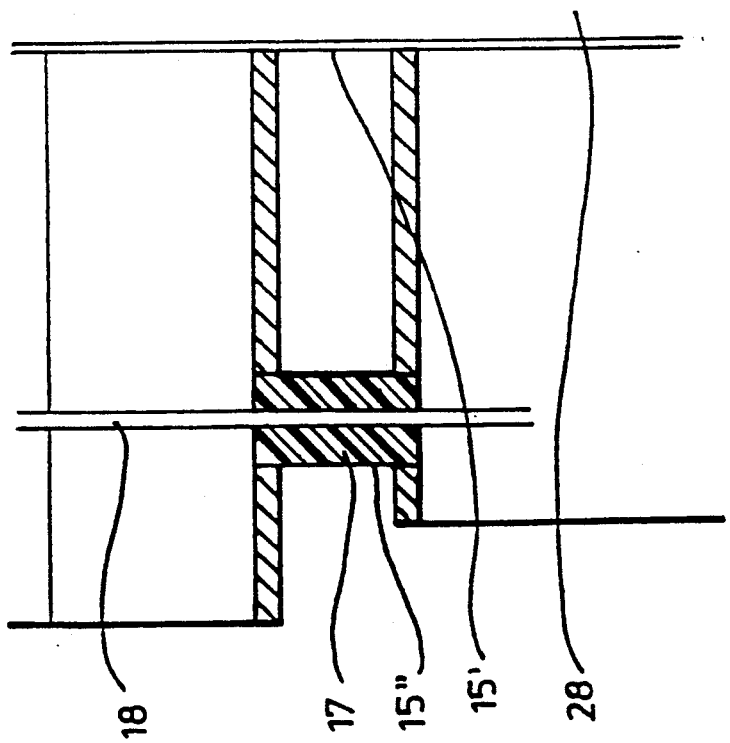
Fig. 2

NMR MAGNET SYSTEM WITH SUPERCONDUCTING COIL IN A HELIUM BATH

BACKGROUND OF THE INVENTION

The invention concerns an NMR magnet system for generating a highly homogeneous magnetic field of high field strength that is highly stable over time, with at least one superconducting magnet coil which is arranged in a first chamber of a cryostat in supercooled liquid helium at a temperature of less than 4.2K, with the cryostat having at least one further chamber containing liquid helium that is essentially at atmospheric pressure with a temperature of approximately 4.2K.

An NMR magnet system of this kind is known from a publication of Williams et al. in Rev. Sci. Instrum. 52 (5), May 1981, pp. 649-656 (American Institute of Physics).

Magnet systems for nuclear spin resonance devices are subject to extremely stringent demands in terms of achievable magnetic field strengths and their homogeneity. At a resonance frequency of 600 MHz, a field strength of 14.1 T (Tesla) must be achieved. The best technical approach to generating these high magnetic field strengths is by means of superconducting magnet coils that have a superconducting short-circuit switch. These superconducting magnet coils require energy only during the energization phase, and, after the current lead is removed, can generate a strong magnetic field without further energy input for a long period in short-circuit mode. In modern superconducting magnets, the time needed for field strength to decay to half its original value is on the order of 5,000 years. This means that in short-circuit mode over periods on the order of hours and days, essentially no change in magnetic field strength occurs. Excellent time stability is particularly necessary for long-term measurements, especially for so-called 2D and 3D measurements. These can be performed only in the superconducting short-circuit mode. In general, the magnet coils are energized once, and then generate a homogeneous magnetic field for years after the leads are removed. In routine operation, helium retention time for the magnet system is typically several months in the case of a "low-loss" cryostat.

NMR spectroscopy, however, requires not only high magnetic field strength but also extremely high spatial homogeneity of the magnetic field that is generated, since resolution is limited by the absolute homogeneity of the magnetic field. Line widths on the order of 10—10 are currently being achieved. At present, attaining even higher magnetic field strengths would require accepting compromises in terms of field homogeneity and field stability, meaning that higher signal strengths would need to be paid for with decreased resolution. This generally cannot be tolerated for NMR measurements. To date, field strengths of up to 20.7 T have been achieved with laboratory magnets in superconducting mode. However, these magnets can generate only low-homogeneity fields, and are generally unsuitable for NMR measurements.

The publication cited above proposes, as a way of obtaining stronger homogeneous magnetic fields and more stable superconductivity, that the superconducting magnet coil be operated at a lower operating temperature than the normal temperature of liquid helium (T=4.2K). This lower temperature is generally produced by pumping down the liquid helium.

The aforesaid document proposes a cryostat that has two concentric helium tanks nested within one another. The outer tank contains liquid helium at T=4.2K under standard pressure (1 bar). A filling line for liquid helium leads from this outer tank to the inner tank, so that liquid helium can be fed from the outer tank into the inner tank. In the inner tank, in which the superconducting coil is located, the helium is pumped down to a pressure of 40 mbar, thus cooling it to a temperature of 2.3K.

One major disadvantage of this arrangement is the fact that the supercooled helium in the inner tank is under partial vacuum, and that the electrical leads, especially those for energizing the superconducting magnet coil, must be passed through the cold vacuum system. This causes primarily sealing problems, but also insulation problems due to penetration of heat into the cold vacuum reservoir via the leads introduced from an environment at room temperature and standard pressure; these problems inevitably lead to greatly reduced helium retention times.

SUMMARY OF THE INVENTION

The object of the present invention is, therefore, to present an NMR magnet system with a superconducting magnet coil in a supercooled helium bath, in which electrical access to the magnet coil is considerably simpler and no vacuum pass-through is required.

This object is achieved, according to the invention, by the fact that the first chamber is connected to the at least single further chamber in such a way that the supercooled liquid helium located in the first chamber is also essentially at atmospheric pressure.

The NMR magnet system according to the invention thus provides for two temperature ranges in the two chambers, such that in the first chamber, liquid helium flowing in from the further chamber at standard pressure and a temperature T=4.2K is cooled, by pumping down through a choke to a non-equilibrium state. In the process, however, the pressure in the first chamber is matched to the pressure in the further chamber. Since the first chamber with the supercooled liquid helium is essentially at atmospheric pressure, the problem of a vacuum pass-through for the electrical leads to the superconducting magnet coil does not occur at all.

In an especially preferred embodiment, the electrical leads needed to energize the superconducting magnet coil are first led through the further chamber before entering the first chamber. As a result, the leads are pre-cooled by the warmer 4.2K reservoir before entering the first, supercooled chamber, and the heat input into the cold reservoir via the supply leads is correspondingly reduced. This leads to considerably lower helium consumption in the first chamber, and thus to lower total consumption of liquid helium and correspondingly longer refill intervals.

In a further embodiment of the invention, a refrigerator with which a portion of the liquid helium can be cooled to a temperature $T \ll 4.2K$, especially to $T \approx 1.8-2.3K$, is provided in the first chamber. Below the lambda point at T=2.17K, helium becomes superfluid and theoretically possesses infinite thermal conductivity. As a result, an extremely homogeneous temperature distribution prevails almost instantaneously in the superfluid portion of the helium bath in the first chamber, since any temperature change within the superfluid bath is immediately equalized. The superconducting magnet coil in a bath of superfluid helium is therefore very effectively and evenly temperature-controlled, which has advantageous effects on the homogeneity of the resulting magnetic field, since distortions and expansions of the magnet system due to temperature gradients are eliminated. Moreover, at lower coil temperatures the achievable magnetic field strengths are higher and superconductivity in general is more stable.

In a further embodiment of the invention, the first and the further chamber together constitute a divided tank, with the first chamber with the supercooled liquid helium being arranged below the further chamber with the helium at $T=4.2K$. Gravity counteracts any backflow of denser and therefore heavier supercooled helium from the lower, cold tank into the upper, warmer tank. This ensures well-defined flow conditions, and no undesired mixing of cold and warm helium occurs in the upper reservoir.

In an advantageous development, the first chamber is separated from the further chamber by a thermally insulating barrier. This not only prevents convection between the two chambers, but also largely prevents heat transfer from one chamber to the other by thermal conduction. The barrier can consist of two plates, made of a material with poor thermal conductivity such as stainless steel or plastic, enclosing a vacuum. The vacuum insulation is a particularly effective means of preventing heat exchange between the upper and lower reservoirs. The vacuum is generally part of the combined vacuum section of the cryostat, so that the barrier does not need to be separately evacuated.

The specific helium consumption is considerably less than with known supercooled systems. In addition, the system is intended to be capable of operation at least part of the time under standard conditions (temperature $T=4.2K$, pressure $p=1$ bar), and even in this operating state it has a very low helium consumption.

In the event of a sudden transition from superconductivity to normal conductivity (quenching), the magnet coil dissipates to the supercooled helium bath an energy of, for example, 4 megajoules in the form of heat. In a particularly preferred embodiment, in order to keep the first chamber from bursting under the resulting increase in pressure, the barrier comprises a pressure relief valve that offers an increased pressure equalization cross section in the barrier when the pressure differential between the first and the further chamber exceeds a certain value.

The pressure relief valve is one of the main thermal bridges between the first and further chambers. Depending on the embodiment, the resulting heat input into the first chamber can vary between approximately 35 mW and approximately 2 mW.

In one particularly simple embodiment, the pressure relief valve consists of a preferably conical plug, made for example of plastic, which is inserted in a hole or seat in the barrier, also preferably conical, which tapers towards the first chamber. The plug is held in position by a weight that is selected so as to ensure proper opening of the valve, for example so that the weight corresponds to the maximum allowable pressure acting on the plug. Instead of the weight, the plug can also be spring-loaded.

The plug can be solid and made of a material with poor thermal conductivity, such as plastic. In a particularly preferred embodiment, a vacuum chamber is provided, preferably by adhesive bonding, on at least one of the heat exchange surfaces of the plug around which helium in the upper or lower chamber flows, in order to prevent thermal contact between plug and helium or at least to reduce the contact region of the relatively large heat exchange surfaces to a small annular region at the edges of the conical section.

The vacuum chamber on the upper heat exchange surface of the plug can be a cylindrical canister, the base surface of which sits concentrically on the upper heat exchange surface and has a diameter at least as great as and preferably greater than the upper heat exchange surface. As a result, the vacuum chamber projects radially, like a shoulder, over the upper edge of the plug, covers the entire upper heat exchange surface, and prevents superficial thermal contact between the solid plug and the helium in the upper chamber.

The vacuum chamber on the lower heat exchange surface of the plug can be a canister in the shape of a conical section, the larger circular surface of which sits concentrically on the lower heat exchange surface, and has at most a diameter as great as that of the lower heat exchange surface, so that the vacuum chamber on the one hand covers as much as possible of the lower heat exchange surface, and on the other hand presents no obstacle to insertion of the plug into the seat. The upper and lower vacuum chambers constitute two particularly simple measures for reducing heat flow through the solid plug.

In a further embodiment, heat conduction between the upper and lower chamber through the plug is minimized by the fact that the plug itself is hollow and evacuated, so that heat conduction takes place only via the outer wall of the plug. To keep the wall thickness of the plug low, it is advantageous if reinforcing rings are provided on the inner walls of the plug. It is also possible, in order to reduce the wall thickness of the seat, to provide reinforcing rings around the surface of the seat that faces away from the plug and is located in vacuum, these being advantageously arranged so that they are concentric with the reinforcing rings provided on the inner walls of the plug when the plug has assumed its normal position in the seat.

In the course of time, microcracks can form in evacuated parts that are bathed in helium, through which the cavities in the parts can fill with helium over long periods of time. If the environment of the parts is then suddenly heated, the increased pressure of the enclosed helium, which might not be able to escape completely in a brief period of time, constitutes an explosion hazard. It is therefore recommended that the evacuated parts of the pressure relief valve be provided with burst protection means, for example in the form of predetermined rupture points.

In a further embodiment, there is provided in at least one wall, not adjacent to the first chamber, of a further chamber a rupture disk that opens up a large cross section leading outside the cryostat when a maximum pressure in the further chamber is exceeded. This protects the entire cryostat from explosion in the event of a particularly large pressure increase.

In a preferred embodiment, there is provided between the first and the further chamber a restricted flow cross section, especially a pressure equalization gap, preferably an annular gap, through which liquid helium can flow from the further chamber into the first chamber. During operation, the gap also acts as a coarse filter for contaminants in the liquid helium, such as frozen air or water, which occur over time especially in a non-sealed helium circuit, and protects the pump filter and magnet coil from contaminants when helium is added. This allows long-term maintenance-free operation of the NMR magnet system, which is typically a component of an analytical instrument.

In a particularly preferred embodiment, the first and the further chamber are suspended in the cryostat by means of thin-walled suspension tubes, and at least one radiation shield is provided between the outer walls of the chambers and the outer walls of the cryostat. These features produce, in contrast to continuous tank systems, a drastic reduction in heat penetration from the outside, and are a prerequisite for a cryostat with low operating losses.

A reduction in operating losses in the first chamber is also achieved, however, by the fact that the first chamber is suspended from the further chamber by externally guided rods with poor thermal conductivity and good tensile strength, made for example of glass-reinforced plastic. If the pass-throughs between the two plates of the barrier, which constitute one of the important thermal bridges between the first and the further chamber, have no load-bearing function, both their number and their material thickness can be reduced, which results in a significantly reduced heat flow into the first chamber.

In a further embodiment, the rods connect the top cover of the further chamber to the plate that forms the top cover of the first chamber, resulting in a stable position for the center of gravity of the suspended first chamber together with the heavy magnet system. In another embodiment, the retaining rods extend from the top cover of the top chamber to the baseplate of the lower chamber. Although this makes the suspension system of the lower chamber somewhat more unstable, and the structure is no longer self-aligning, on the other hand particularly long connecting rods can be used, which correspondingly decreases heat conduction through the rods from the upper to the lower chamber, assuming the same rod cross section.

In a further embodiment, there is arranged on the top of the cryostat at least one tower in which helium evaporating and/or pumped out from the cryostat releases its residual enthalpy to the radiation shields provided in the cryostat, and from which the evaporating helium emerges at approximately ambient temperature. In addition, the electrical leads to the magnet system and the conduits for adding liquid helium can each advantageously run within a tube guided within the tower or towers.

In a particularly preferred development of this embodiment, at least two and preferably three towers are arranged in a ring, so that the helium evaporating and/or pumped off from the cryostat is distributed as uniformly as possible to all the towers.

Since the cryostat contains two chambers with helium at two different temperature levels, there are two waste gas flows at different pressure levels. One waste gas flow results from the helium evaporating at atmospheric pressure from the further chamber; the second waste gas flow consists of the helium pumped down by the refrigerator at a pressure of approximately 40 mbar. Depending on the operating state of the cryostat, the two waste gas flows are of different intensities, and under some conditions the waste gas flow from the further chamber can come to a complete standstill. It is essential for a low-loss cryostat that the enthalpy contained in the waste gas be utilized as completely as possible. For this purpose it is necessary to distribute the two waste gas flows, regardless of their intensity, uniformly to the various towers and the shields coupled thereto.

Particularly preferred is an embodiment in which an annular heat exchanger in the form of a hollow tube, through which the helium evaporating and/or pumped out of the cryostat is led out, and to the outside of which the radiation shields are coupled in a thermally conductive manner, is arranged in the tower. It is also advantageous if the electrical leads to the magnet system and the conduits for liquid helium are carried through the tube which passes in each case through the tower or towers. This hollow-tube design results in a dual cryostat that can be used both at 4.2K under standard pressure and under vacuum in a range between, for example, 1.8K and 2.3K. The cryostat has low-loss properties in both operating modes, since irrespective of the particular fraction of the pumped or evaporating helium flow, the entire enthalpy present in both gas flows together is largely transferred to the cryostat's shield system.

In a preferred development of this embodiment, at least two and preferably three towers are arranged in a ring, so that the evaporating and/or pumped helium is distributed uniformly to all the towers by means of a distributor. Uniform distribution of the cold waste gas flows to all the towers eliminates varying temperature stratifications within the towers, and keeps the temperature of the warm portion of the cryostat constant. Otherwise, if the outflow of cold helium is not uniform, insufficient cooling can occur in individual towers, while other towers freeze up. This would result in increased helium consumption and in differing, thermally caused length changes in the suspension systems for the devices placed in the towers, which in turn would cause tilting of the chambers, degraded magnetic field homogeneity, and shifts in the measured values of the NMR signal.

In certain embodiments, chokes with permanently defined flow cross sections or manually or electromechanically adjustable valves can be provided for uniform distribution of exhaust gas flows to the individual towers.

Flow monitors measuring the volumes of evaporating and pumped helium flowing through the towers can also be provided.

One particularly preferred embodiment provides for a flow regulation device which automatically regulates the volumes of evaporating and pumped helium flowing through the towers.

With very good thermal insulation of the chambers (low-loss cryostat), during operation the first chamber might draw from the further chamber, via thermal bridges that still exist (such as plugs, etc.), more heat than flows from outside into the further chamber, thus cooling the latter to the point that the pressure in the further chamber decreases. Because of the reduced pressure, air and moisture would then be drawn in by the further chamber so that, for example, the evaporation lines might freeze up and clog. To eliminate this safety risk, a variety of measures that prevent the temperature in the further chamber from dropping below $T=4.2K$ are described below.

The most inexpensive and technically simplest solution to preventing supercooling of the further chamber provides for a heating element that is arranged in the further chamber.

A further measure to reduce heat input into the first chamber consists in the fact that in a particularly preferred embodiment, a deflector radiation shield that is in thermally conductive contact with the further chamber is arranged at a distance around the first chamber. This deflector radiation shield, kept at a temperature $T=4.2K$, protects the first chamber from the residual heat penetrating from outside and dissipates it to the further chamber, so that the latter experiences a greater heat input from outside, which exceeds the heat dissipation to the first chamber and provides an additional cooling effect for the first chamber.

NMR magnet systems are usually equipped with devices that allow short-circuit operation of the at least single superconducting magnet coil. These are generally removable electrical leads by which the magnet coil is energized and a superconducting switch. As soon as rated current is reached in the superconducting coil, the superconducting switch is closed, the supply current is lowered, and the leads are removed. The current in the coil flows without resistance with a half-life on the order of 5,000 years, with no need for re-energization.

The invention will be explained and described in more detail below with reference to the exemplary embodiments depicted in the drawings. The features evident from the description and the drawings may be applied to other embodiments of the invention individually or severally in any combination. In the drawings:

BRIEF DESCRIPTION OF THE DRAWINGS

FIG. 2 shows a schematic vertical section through a transition region from the first to the further chamber, with the barrier located between them;

FIG. 3 is a depiction of the refrigerator element located in chamber 1;

FIG. 4 shows a schematic vertical section through a second NMR magnet system according to the invention, with the direction and magnitude of the calculated heat flows in the cryostat drawn in;

DETAILED DESCRIPTION OF THE PREFERRED EMBODIMENTS

Figure 1:
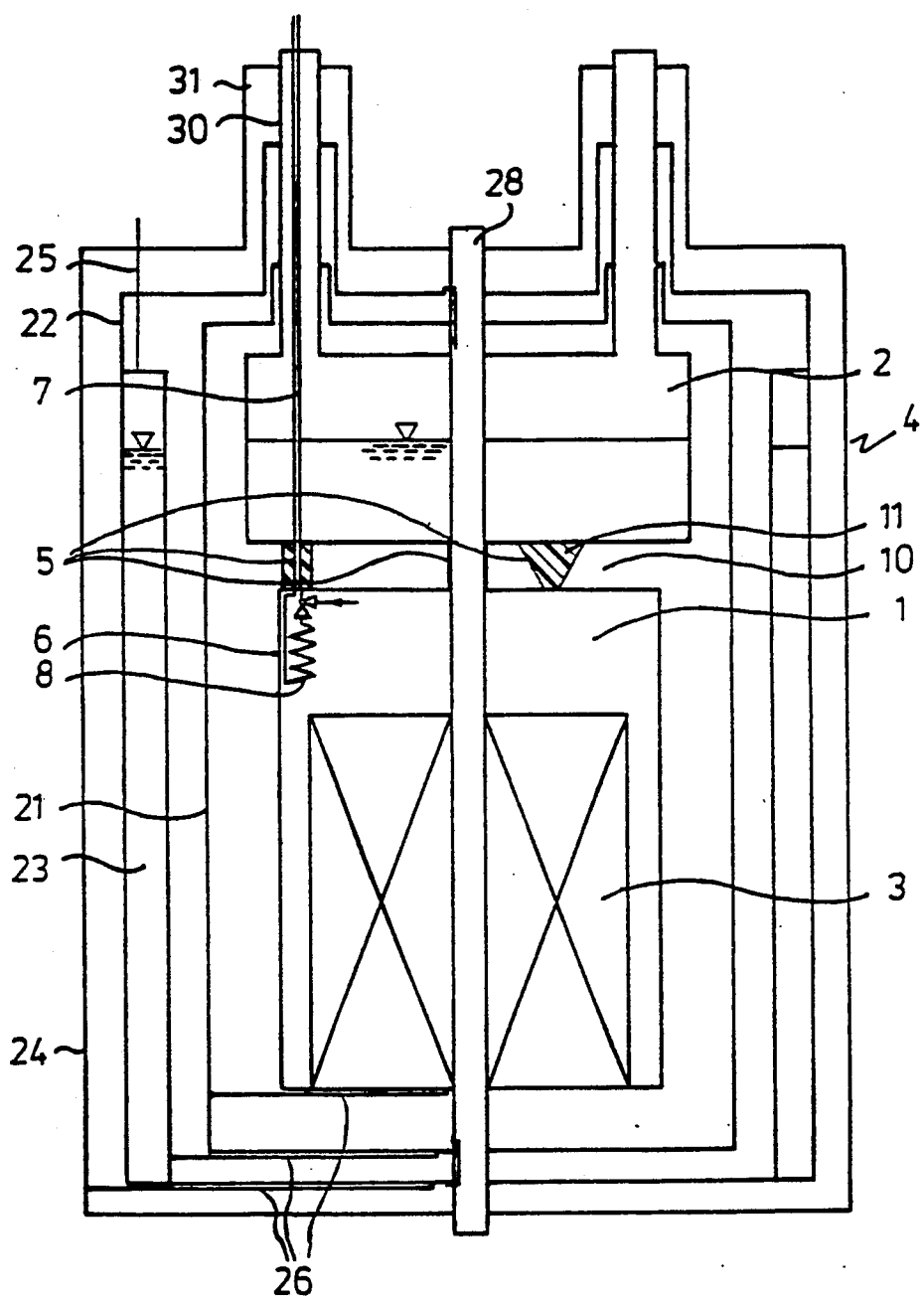
FIG. 1 shows a schematic vertical section through a first NMR magnet system according to the invention.

The NMR magnet system depicted schematically in FIG. 1 is used to generate a highly homogeneous magnetic field of high field strength that is highly stable over time by means of a superconducting magnet coil 3 arranged in a first chamber 1 in a cryostat 4. In the exemplary embodiment depicted, the superconducting magnet coil 3 is drawn schematically as a single solenoid coil.

Arranged above the first chamber 1 is a further chamber 2 which is separated from the lower first chamber 1 by a thermally insulating barrier 10 and together with the first chamber 1 constitutes a two-part tank.

Located in the further chamber 2 are approximately 180 liters of liquid helium at atmospheric pressure at a temperature of 4.2K, which in the cryogenic system depicted is sufficient for approximately 7 weeks of operation. The liquid helium can flow through a constricted cross section, here in the form of one or more annular gaps 5, from the upper chamber 2 into the lower chamber 1, where it is cooled by means of a refrigerator 6 to a temperature considerably below 4.2K, especially to approximately 1.8K to 2.3K. The refrigerator 6 can be implemented as a closed cooling circuit. In the simplest case, however, helium is pumped out of the lower chamber 1 through a choke. The liquid helium that in each case flows back from the upper chamber 2 into the lower chamber 1 ensures that the supercooled liquid helium in the first chamber 1 is at all times in a non-equilibrium state at atmospheric pressure. The refrigerator 6 can, by means of a valve 32 that is depicted schematically in FIG. 1 and in detail in FIG. 3, pump liquid helium out of the first chamber 1 for expansion. When the helium in the refrigerator is pumped out, the helium expands and causes supercooling of the helium bath in the first chamber. The valve 32 can additionally be equipped with a fine sieve 35 to prevent any smaller contaminants in the helium that may have passed through the narrow flow cross section from penetrating into the refrigerator 6.

To reduce the radiation energy impinging on the helium tank, the latter is surrounded by a radiation shield 21 that is kept at approximately 40K and is surrounded by a hollow cylindrical cooling tank 23 that contains approximately 250 liters of liquid nitrogen, which is sufficient for approximately 6 weeks of operation. Liquid nitrogen can be added to the cooling tank 23 through four tubes 25 distributed around the periphery. A further radiation shield 22 that is correspondingly kept at a temperature of approximately 80K, as well as superinsulation, is provided in the top and bottom regions of the cooling tank 23.

In the present exemplary embodiment, the radiation shields 21, 22 and the cooling tank 23 are made of AlMg3 with wall thicknesses between 3 mm and 6 mm. The manner in which the chambers 1 and 2, radiation shields 21 and 22, and cooling tank 23 are suspended in the cryostat 4 on suspension tubes 30 is depicted only schematically in FIG. 1. The connecting elements used are thin-walled tubes or bundles of three centering rods 26 each, a few millimeters in diameter, which have extremely low thermal conductivity and high tensile strength. In contrast to known continuous tank systems, these features cause a reduction in heat penetration from outside. The cryostat can thus be operated with very low heat losses.

The radiation shields 21 and 22 are arranged, as indicated only schematically in FIG. 1, at a short distance from one another and in a radial sequence corresponding to their particular temperature around a central tube 28 kept at room temperature, through which the NMR sample is inserted into the magnetic field of the superconducting magnet coil 3.

It is preferred if at least two, and preferably three towers 31, through which the helium evaporating from the cooling coil is guided to the outside, are arranged annularly on the top of the cryostat 4. Chokes (not depicted) with a predefined flow cross section or valves with an adjustable flow cross section are provided to ensure uniform distribution of the evaporating helium to the towers 31. It is also possible and preferable to use flow monitors, which measure the volumes of the outgoing helium flows through the towers 31 and deliver the measured flow values to a flow regulation device which automatically regulates the volumes flowing into the individual towers.

FIG. 2 depicts in somewhat more detail the barrier 10 that separates the first chamber 1 from the further chamber 2. In the exemplary embodiment shown, it consists of stainlesssteel plates 12 and 13 and connecting elements between these plates. In particular, the two plates 12 and 13 are each 15 mm thick, and in other exemplary embodiments can be made of a material that preferably has poor thermal conductivity, such as glass-reinforced plastic, Teflon, or another plastic of this type. The connecting elements between the plates 12 and 13 which act as thermal bridges between the lower and upper chambers must have the lowest possible thermal conductivity. The plates are spaced approximately 75 mm apart from one another, and are separated from one another by thin-walled cylinders 15', 15" with diameters between 60 mm and 75 mm and wall thicknesses of approximately 0.85 mm, or a conical seat 16 with a minimum diameter of 60 mm and a maximum diameter of 180 mm, and a wall thickness of 1 mm. The space between the upper plate 12 and lower plate 13 is evacuated, and preferably connected to the combined vacuum section of the cryostat 4.

Located in the conical seat 16 is a conical plug 11, which in the presence of a certain excess pressure in the first chamber 1 with respect to the further chamber 2 is forced into the further chamber 2 and thereby offers a correspondingly large pressure equalization cross section from chamber 1 to chamber 2. The conical plug 11 is made of a material with poor thermal conductivity, preferably Teflon. In other embodiments it can also be replaced by different elements acting as pressure relief valves. To protect the cryostat arrangement against an explosion due to excess pressure building up within the arrangement, for example in the event of a quench, one or more rupture disks (not depicted) are provided; these may, for example, seal off the upper chamber 2 at the upper end of the towers 31 from the outside of the cryostat 4, and offer a pressure equalization cross section to the outside in the event of a particularly large pressure increase within the upper chamber 2.

Provided inside the thin-walled cylinder 15" is a cylindrical plug 17 through which is provided, in a center hole, a pass-through tube 18 for the valve stem 7 of the refrigerator 6, for the electrical leads to the superconducting magnet coil 3, and as a flow cross section for liquid helium to pass from the upper chamber 2 into the lower chamber 1. In other embodiments a plurality of cylindrical plugs 17 can also be provided, among which the individual pass-through functions listed above, as well as others, are then distributed.

The superconducting magnet coil 3 is energized with electrical current by means of electrical leads (not depicted), which are guided through the further chamber 2 before entering the first chamber 1 and are thus precooled. After the superconducting magnet coil 3 is energized, portions of the leads are removed and the superconducting magnet coil 3 is operated in short-circuit mode.

Nb$_3$Sn and Nb$_3$Sn with tantalum are envisaged as coil materials for the radial inner portion of the superconducting magnet coil 3 which generates particularly strong fields. Wound in series with the inner coil portion is an outer coil portion made of NbTi conductive elements, which generates a magnetic field of lesser field strength.

The arrangement according to the invention thus represents an NMR magnet system that is easier to handle, more reliable in operation, and more economical in its consumption of cryogenic fluid, especially liquid helium, than a conventional supercooled system.

FIG. 3 depicts in detail the valve 32 reproduced schematically in FIG. 1. This valve 32 is configured as a needle valve, and is located immediately beneath the barrier 10. The needle valve 32 consists, among other elements, of an essentially cylindrical valve housing 33 which has radial discharge openings 34 through which liquid helium can flow from the first chamber 1 into the interior of the valve 32. As already mentioned above, the needle valve 32 has a fine sieve 35 with which contaminants can be filtered out of the helium. This fine sieve is supported on plate-shaped retainers 36 and 37 that are provided at the upper and lower ends of the valve housing 33. Moreover, the valve 32 has a valve drive 38, the end of which located in the valve housing 33 is provided with a valve needle 39. This valve needle 39 is mounted by means of the valve drive 38 in an axially displaceable manner in a valve orifice 40. In the view reproduced in FIG. 3, the valve 32 is in the closed position, in which the valve needle 39 completely seals the valve orifice 40. When the valve needle 39 is pulled axially upward out of the valve orifice 40, the valve 32 is then in an open position, with the opening cross section depending on the axial displacement of the valve needle 39. In this open position, liquid helium can flow out of the first chamber 1, through the fine sieve 35, through the discharge openings 34, past the valve needle 39, through the valve orifice 40, and into a heat exchanger 41. This heat exchanger consists essentially of one inner and one outer helical cooling coil 42 and 43, with the two cooling coils being arranged coaxially with one another. The inner cooling coil 42 is supplied, via a coaxial downpipe 44, with the liquid helium emerging from the valve orifice 40, which rises in this cooling coil 42 until reaching its upper end. At the upper end, this cooling coil 42 is connected to the outer cooling coil 43, in which the helium then flows back downward. From the lower end, the helium is brought upward, through a pumping conduit 45 provided outside the cooling coil 43, out of the first chamber 1. The outflowing helium expands, which causes supercooling of the still-liquid helium. This supercooled liquid helium located in the heat exchanger 41 draws heat out of the helium that is located in the first chamber 1 and is circulating around the heat exchanger 41, so that this helium reaches a temperature of 1.8 to 2.3K. Since the helium located in the heat exchanger 41 gradually evaporates out of it, the individual heat exchanger elements contain a mixture of liquid and gaseous helium. The evaporated helium fraction is continually returned through the needle valve 32 back to the heat exchanger 41. By changing the valve cross section of the valve orifice 40, more or less helium can flow into the heat exchanger 41, so that the cooling output of the refrigerator 6 can be controlled.

Figure 4:
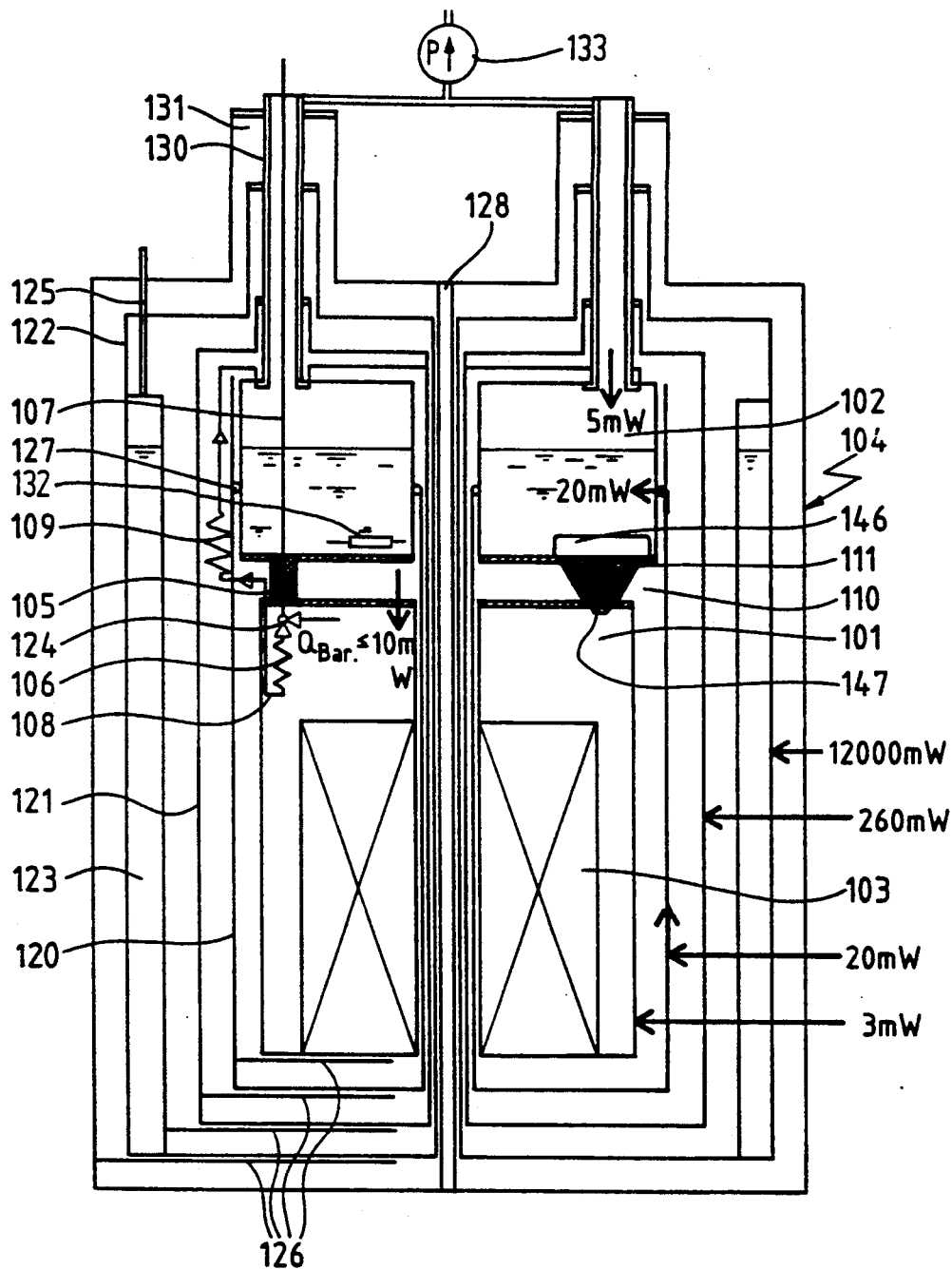
Figure 4:
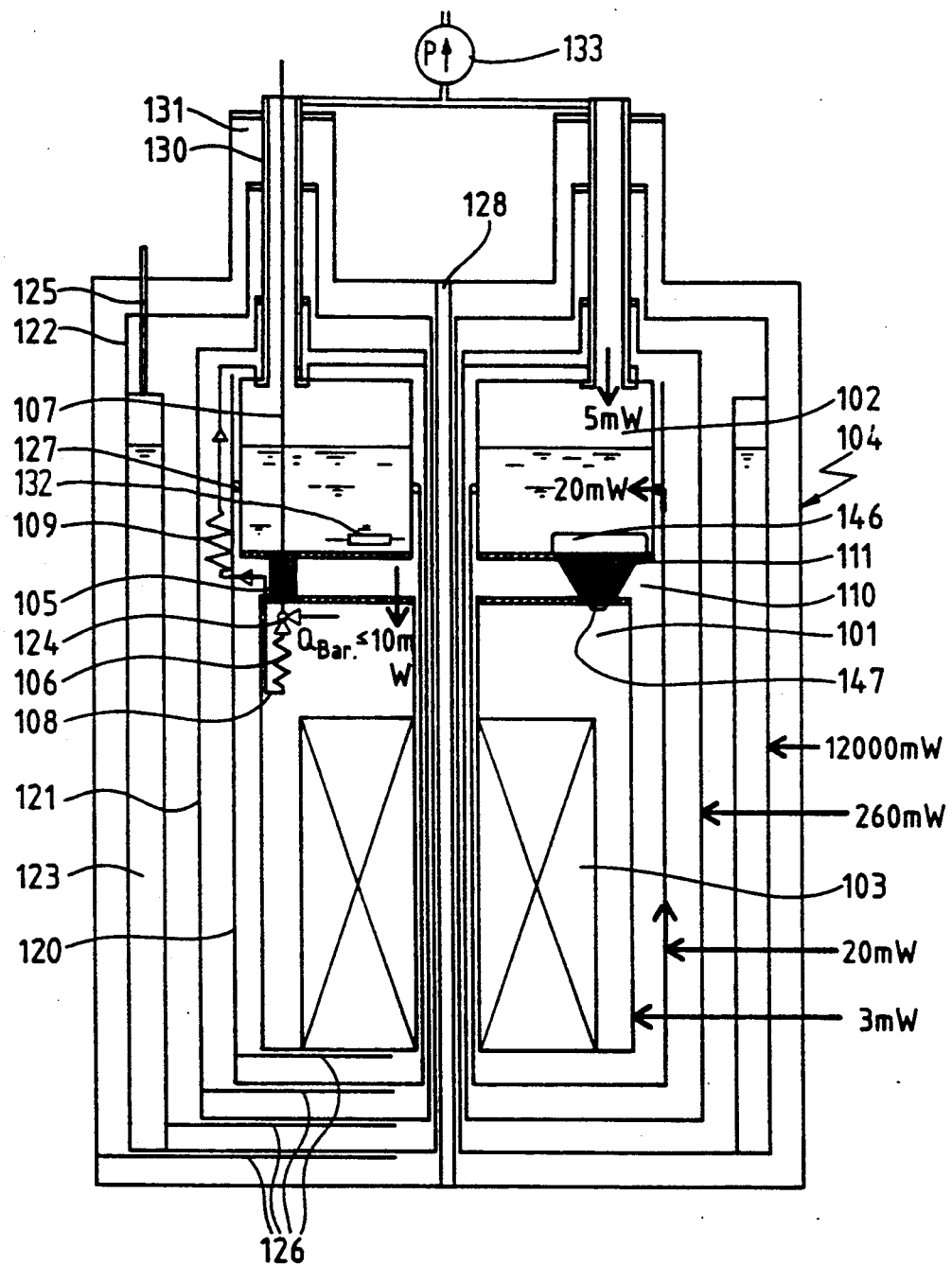

The NMR magnet system depicted schematically in FIG. 4 is used to generate a highly homogeneous magnetic field of high field strength that is highly stable over time by means of a superconducting magnet coil 103 arranged in a first chamber 101 in a cryostat 104. In the exemplary embodiment depicted, the superconducting magnet coil 103 is drawn schematically as a single solenoid coil.

Arranged above the first chamber 101 is a further chamber 102 which is separated from the lower first chamber 101 by a thermally insulating barrier 110 and together with the first chamber 101 constitutes a two-part tank.

Located in the further chamber 102 are approximately 180 liters of liquid helium at atmospheric pressure at a temperature of approximately 4.2K, which in the cryogenic system depicted is sufficient for approximately 20 weeks of operation. The liquid helium can flow through a constricted cross section, here in the form of one or more annular gaps 105, from the upper chamber 102 into the lower chamber 101, where it is cooled by means of a refrigerator 106 to a temperature considerably below 4.2K, especially to approximately 1.8K to 2.3K. The refrigerator 106 can be implemented as a closed cooling circuit. In the simplest case, however, helium is pumped out of the lower chamber 101 through a choke. The liquid helium that in each case flows back from the upper chamber 102 into the lower chamber 101 ensures that the supercooled liquid helium in the first chamber 101 is at all times in a non-equilibrium state at atmospheric pressure. By means of a schematically depicted valve 124, the refrigerator 106 can pump liquid helium out of the first chamber 101 for expansion and thus for further cooling. The valve 124 can additionally be equipped with a fine sieve to prevent any smaller contaminants in the helium that may have passed through the narrow flow cross section from penetrating into the refrigerator 106.

Pumping the helium in the refrigerator out causes supercooling of the helium bath in the first chamber. The pumped helium gives up its residual enthalpy, via a further cooling coil 109 to the deflector radiation shield 120 and via annular heat exchangers 130 that are arranged inside towers 131 to the further radiation shields 121 and 122, so that the pumped and evaporating helium ultimately emerges from the towers 131 at approximately room temperature. Calculations and experiments have determined that in each case a single hollow tube arranged in a tower 131 is sufficient, as an annular heat exchanger 130, to guarantee that the evaporating and pumped helium, despite a relatively high flow velocity and low pressure, still gives up a significant portion of its enthalpy to the environment. Complex cooling coils and structures in the towers 131 can thereby be eliminated.

The innermost radiation shield of the arrangement, the deflector radiation shield 120, is attached at one point 127 in a thermally conductive manner to the upper chamber 102, and is therefore at a temperature of approximately 4.2K. The deflector radiation shield 120 is essentially separated by vacuum from the lower chamber 101 with the supercooled helium bath. The result is that the heat collected by the deflector radiation shield 120 is dissipated to the upper chamber 102, so that the lower chamber 101 is better shielded against heat flowing in from outside than is the upper chamber 102. This ensures that the helium bath in the upper chamber 102 is always at approximately 4.2K during operation. This is because, when the cryostat arrangement is very well insulated as intended, the cold lower chamber 101 might cool the warmer upper chamber 102, via the thermal bridges that still exist in the barrier 110, to such an extent that the pressure in the upper chamber 102 above the helium level would drop below atmospheric, and the upper chamber 102 would draw in air. A heating element 132 may be provided in the upper chamber 102.

A radiation shield like the deflector radiation shield 120 that is kept at approximately 5K is extremely unusual and surprising in cryotechnology. While normally the primary task of a radiation shield is to keep the volume that it surrounds cool, the deflector radiation shield 120 causes externally irradiated heat to be deflected to the further chamber 102. This radiation shield would be useless in terms of the overall heat balance, and therefore uneconomical. If the intention were simply to reduce evaporation of liquid helium from the lower chamber, its use would make no sense. In the present case, however, the deflector radiation shield acts as a heat separator, ensuring that the vapor pressure above the helium level in the warmer further chamber is always high enough to ensure that no air is drawn in from outside.

A rough estimate yields a heat flow through the barrier 110 of approximately 10 mW; counteracting this is approximately 5 mW of heating of the further chamber 102 via the hollow tubes, and approximately 20 mW by heat radiation, for a total of 25 mW. The evaporation rate from the chamber 102 should then correspond, without additional measures, to a heat output of (25−10) mW = 15 mW. If there were even a slight drop in the external heat flow or an increase in heat flow through the barrier, the first chamber 101 would therefore cool the further chamber 102.

To reduce the radiation energy impinging on the helium tank, the latter is surrounded by a radiation shield 121 that is kept at approximately 40K and is surrounded by a hollow cylindrical cooling tank 123 that contains approximately 250 liters of liquid nitrogen, which is sufficient for approximately 6 weeks of operation. Liquid nitrogen can be added to the cooling tank 123 through four tubes 125 distributed around the periphery. A further radiation shield 122 that is correspondingly kept at a temperature of approximately 80K, as well as superinsulation, is provided in the top and bottom regions of the cooling tank 123.

In the present exemplary embodiment, the deflector radiation shield 120, the further radiation shields 121, 122, and the cooling tank 123 are made of $AlMg_3$ with wall thicknesses between 3 mm and 6 mm. The manner in which the chambers 101 and 102, radiation shields 120, 121, and 122, and cooling tank 123 are suspended in the cryostat 104 on the hollow tubes 130 is depicted only schematically in FIG. 4. The connecting elements used are thin-walled tubes and bundles of three centering rods 126 each, preferably made of glass-reinforced plastic with a diameter of a few millimeters, which have extremely low thermal conductivity and high tensile strength. The radiation shields 120, 121, and 122 are arranged, as indicated only schematically in FIG. 4, at a short distance from one another and in a radial sequence corresponding to their particular temperature, around a central tube 128 kept at room temperature, through which the NMR sample is inserted into the magnetic field of the superconducting magnet coil 103.

Figure 9:
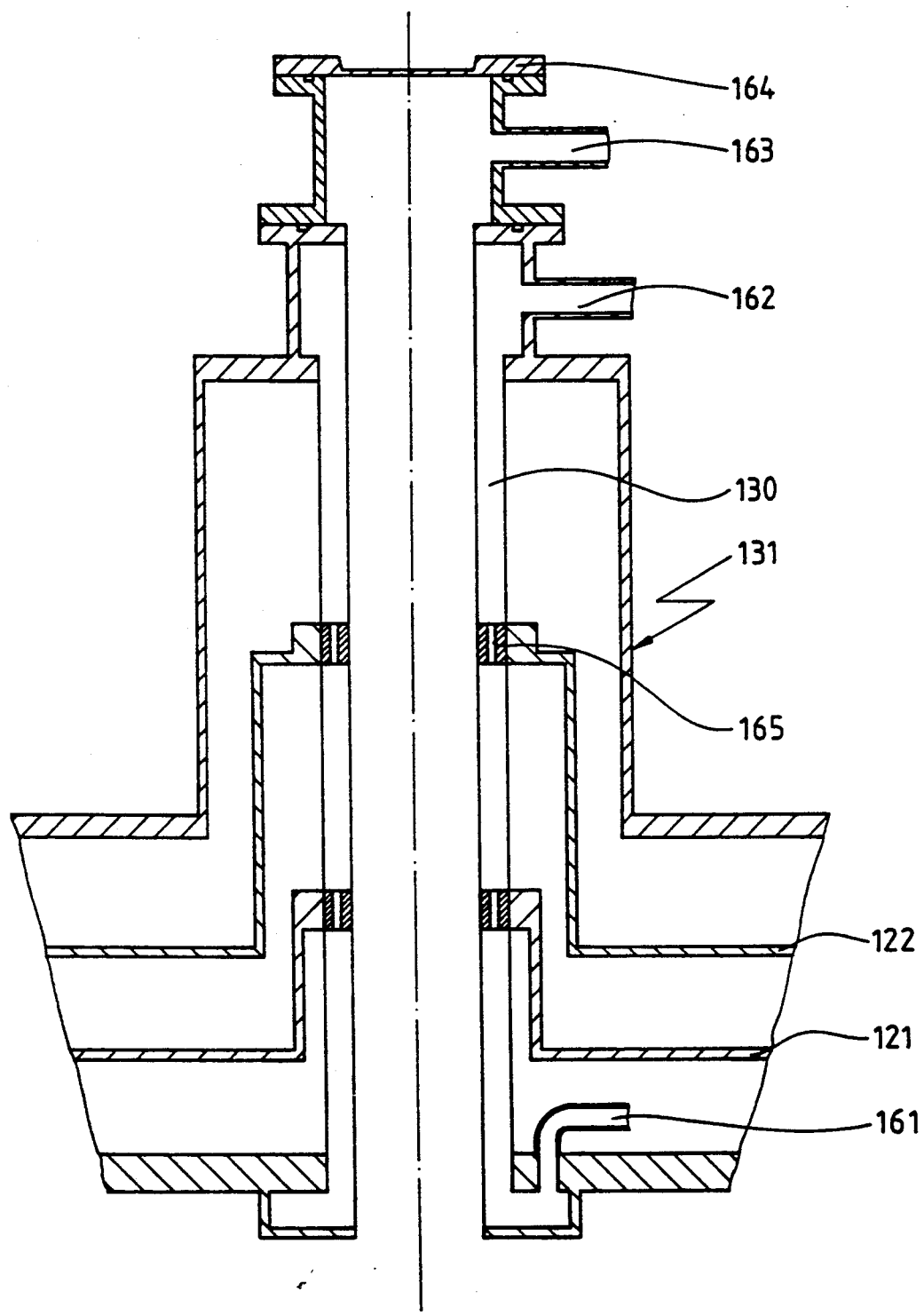
FIG. 9 shows a schematic vertical section through an annular heat exchanger.

FIG. 9 shows a cross section through a tower 131 in somewhat greater detail. The pumped helium from the refrigerator 106 is introduced through the inlet 161 into the annular heat exchanger 130, from which it re-emerges through the outlet 162. As described above, the further radiation shields 121, 122 are thermally coupled, at a vertical distance from one another, to the annular heat exchanger 130. The helium evaporating from the upper chamber 102 leaves the tower 131 through the outlet 163. The enthalpy contained in the evaporating helium is also given up, via the thermal bridges 165 of the annular heat exchanger, to the shields 121, 122. It is preferred if at least one and preferably three towers 131, to which the evaporating and pumped helium is uniformly distributed by distributors (not depicted), are arranged annularly on the top of the cryostat 104. Chokes (also not depicted) with a predefined flow cross section or valves with an adjustable flow cross section are provided for this purpose. It is also possible and preferable to use flow monitors which measure the volumes of the outgoing helium flows through the towers 131 and deliver the measured flow values to a flow regulation device which automatically regulates the volumes flowing into the individual towers. In the simplest case, the distributor consists of a chamber into which project on the one hand the relatively large flow cross sections of the hollow tubes 130, and other other hand the narrow cross section of the conduit for the helium discharged from the refrigerator 106, which represents the greatest flow resistance in the helium outlet system. A uniform pressure generated via the hollow tubes 130 by means of a pump 133 is therefore present in the distributor chamber.

The main thermal bridges from the first chamber 101 to the next warmer environment are the connections between the first chamber 101 and the further chamber 102, in other words essentially the pass-throughs through the barrier 110. To minimize heat flow into the first chamber 101 through these thermal bridges, the thermal conductivity of the corresponding connecting elements must therefore be as low as possible.

Figure 5:
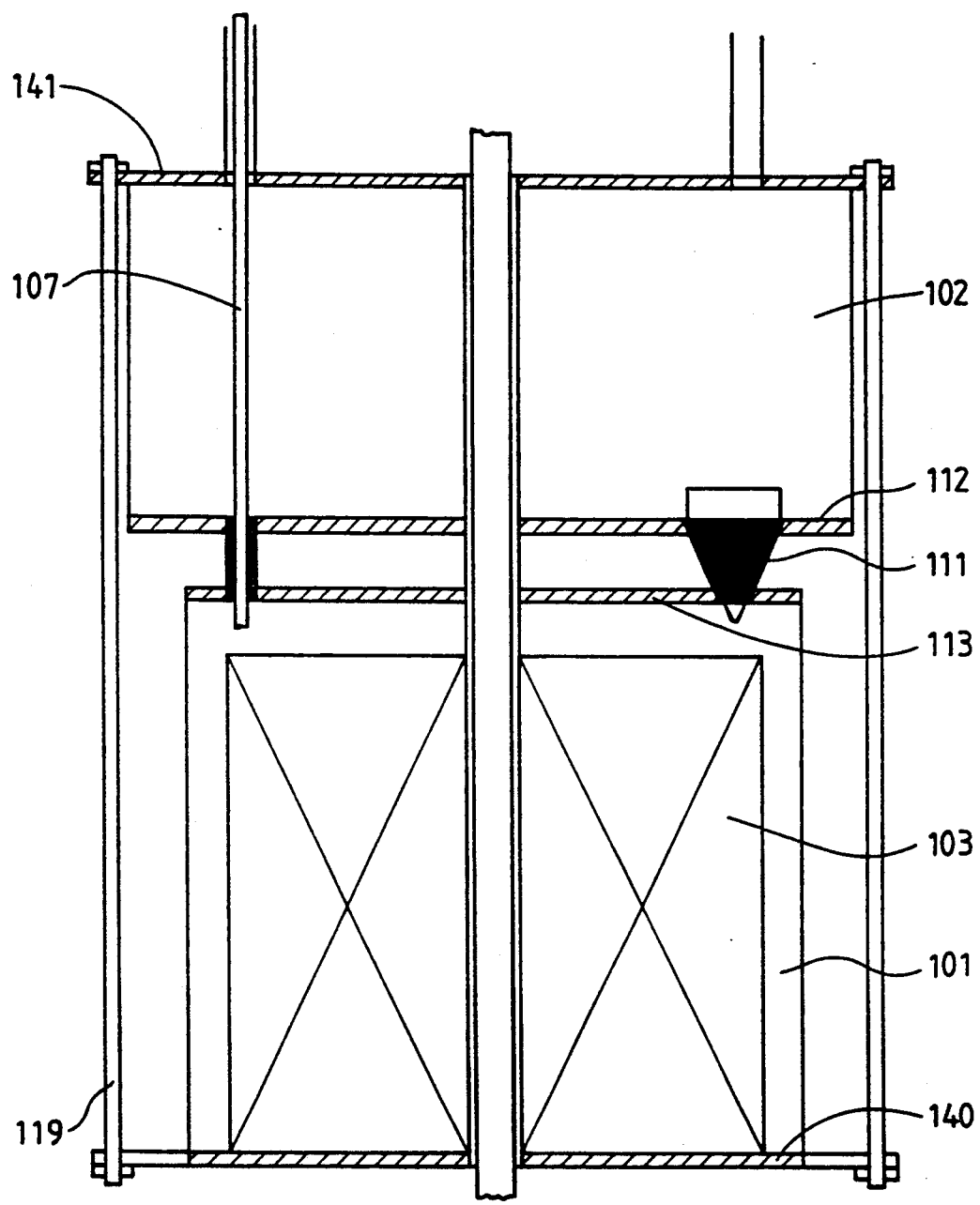
FIG. 5 shows a schematic vertical section through the further chamber of the second magnet system, with the first chamber suspended therefrom.

On the other hand, a strong suspension system for the first chamber 101 is needed, since the latter must support the magnet coil 103 weighing approximately 1.500 kilograms, which is preferably arranged vertically on the floor 140 of the first chamber 101, as shown in FIG. 5.

In order to implement the pass-throughs through the barrier 110 with the minimum possible wall thickness, the first chamber 101 is preferably suspended from the further chamber by means of externally guided fastening elements with poor thermal conductivity but extremely high tensile strength, (in the example shown, rods 119 made of glass-reinforced plastic). Because of the very thin connecting walls in the barrier 110, which now no longer perform any load-bearing function, heat flow into the first chamber 101 can be reduced from approximately 5 mW almost to 1 mW.

Thermal conduction through the rods 119 decreases, with constant rod cross section, in inverse proportion to rod length. It is therefore advantageous for the rods 119 to be as long as possible. In the exemplary embodiment shown in FIG. 5, the rods 119 may connect the plate 113, which constitutes the top cover of the first chamber 101, to the top cover 141 of the further chamber 102, resulting in a stable location for the center of gravity of the suspended first chamber 101. However, heat flow through the rods 119 can be further reduced by a factor of approximately 3 if the rods 119 connect the floor 140 of the first chamber 101 to the top cover 141 of the further chamber 102, although the suspension system does become somewhat more unstable.

Figure 6:
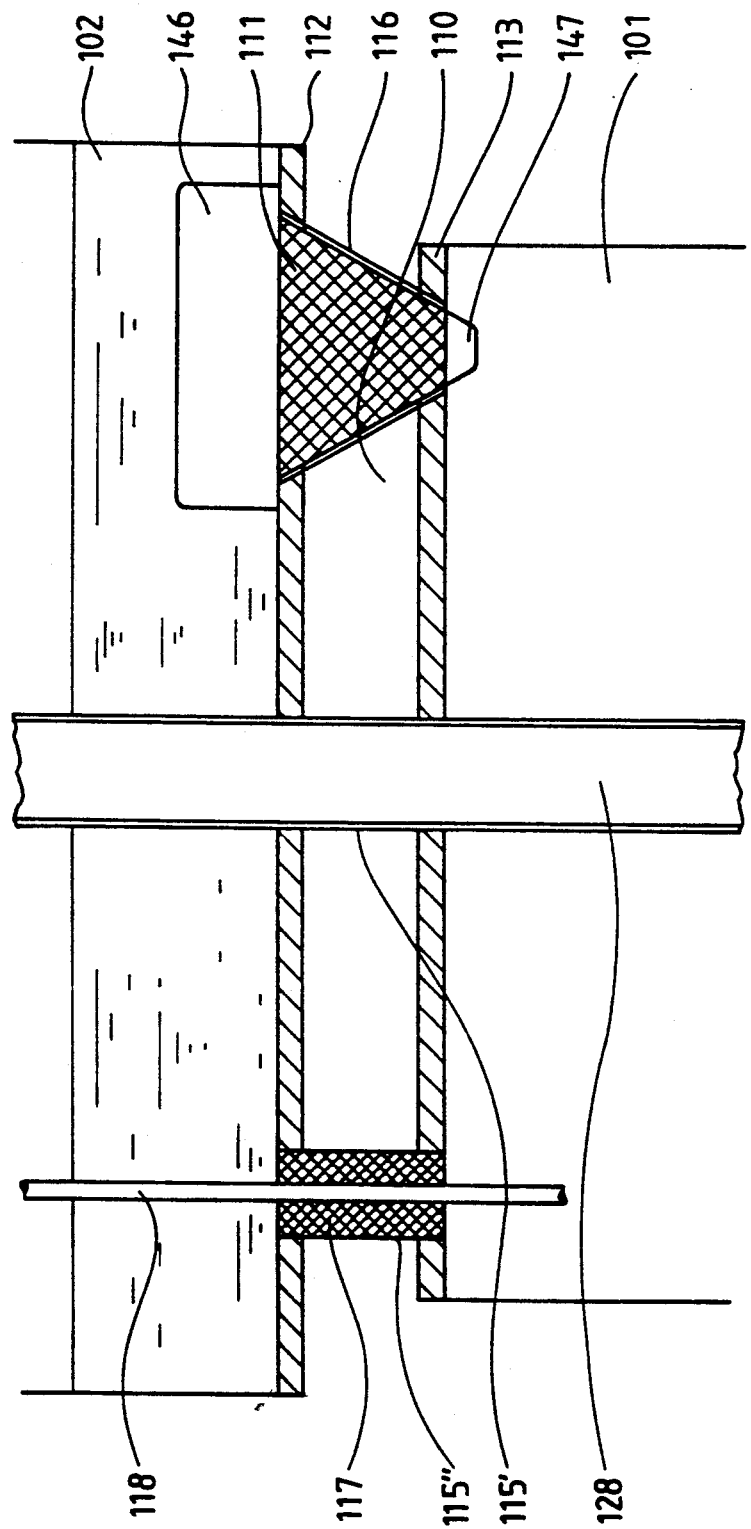
FIG. 6 shows a schematic vertical section through a transition region from the first to the further chamber, with the barrier located between them.

FIG. 6 depicts in somewhat more detail the barrier 110 that separates the first chamber 101 from the further chamber 102. In the exemplary embodiment shown, it consists of an upper plate 112 and a lower plate 113, each 15 mm thick. The connecting elements between the plates 112 and 113 which act as thermal bridges between the lower and upper chambers must have the lowest possible thermal conductivity. The plates are spaced approximately 75 mm apart from one another, and are separated from one another by thin-walled cylinders 115', 115" with diameters between 60 mm and 75 mm and wall thicknesses of approximately 0.85 mm, or a conical seat 116 with a minimum diameter of 60 mm and a maximum diameter of 180 mm, and a wall thickness of 1 mm. The space between the upper plate 112 and lower plate 113 is evacuated, and preferably connected to the combined vacuum section of the cryostat 104.

Seated in the conical seat 116 is a conical plug 111, which in the presence of a certain excess pressure in the first chamber 101 with respect to the further chamber 102 is forced into the further chamber 102 and thereby offers a correspondingly large pressure equalization cross section from chamber 101 to chamber 102. The conical plug 111 is made of a material with poor thermal conductivity, preferably Teflon, and as shown for example in FIG. 7a, has a heat exchange surface 145 facing the first chamber 101 and a heat exchange surface 144 facing the further chamber 102, which are exposed to the helium in the respective chambers. To ensure that the plug 111 is guided vertically without jamming, at least two guide rods 143 are provided, arranged annularly around the seat 116.

In alternative embodiments, the plug 111 can also be replaced by different elements acting as pressure relief valves. To protect the cryostat arrangement against an explosion due to excess pressure building up within the arrangement, for example in the event of a quench, one or more rupture disks 164 depicted in FIG. 9 are provided; these may, for example, seal off the upper chamber 102 at the upper end of the cooling towers 131 from the outside of the cryostat 104, and offer a pressure equalization cross section to the outside in the event of a particularly large pressure increase within the upper chamber 102.

Provided inside the thin-walled cylinder 115" is a cylindrical plug 117 through which is provided, in a center hole, a pass-through tube 118 for the valve stem 107 of the refrigerator 106 depicted schematically in FIG. 4, for the electrical leads to the superconducting magnet coil 103, and as a flow cross section for liquid helium to pass from the upper chamber 102 into the lower chamber 101. In other embodiments a plurality of cylindrical plugs 117 can also be provided, among which the individual pass-through functions listed above, as well as others, are then distributed.

Figure 7B:
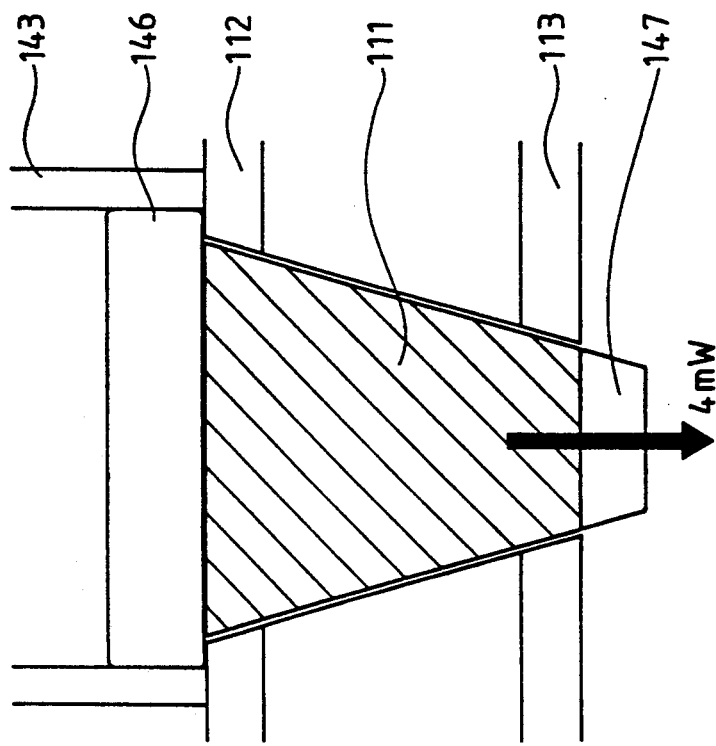
FIG. 7 shows a schematic vertical section through the conical plug
  a) without and
  b) with vacuum chambers on the heat exchange surfaces.
Figure 7A:
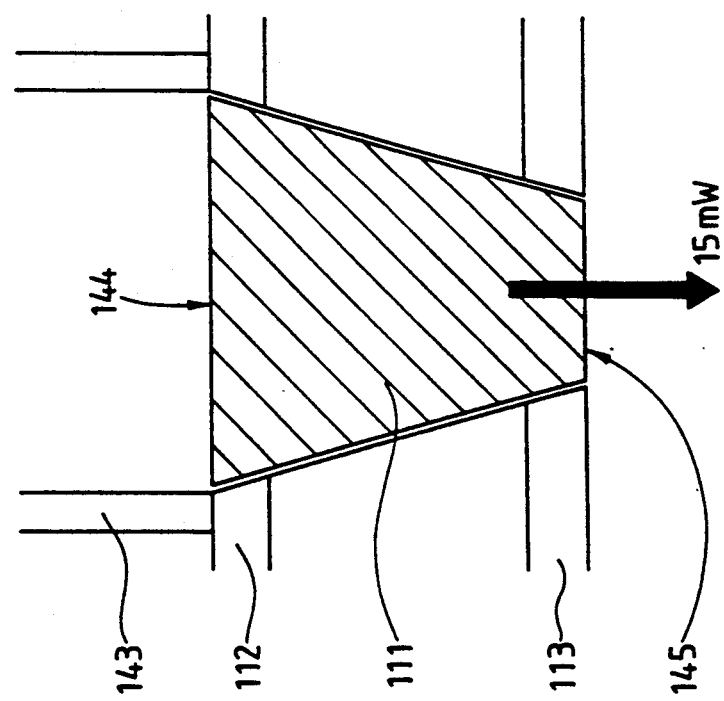

In the exemplary embodiment shown in FIG. 7b, vacuum chambers 146, 147 are applied, preferably by adhesive bonding, onto the heat exchange surfaces 144, 145 of the plug 111 in order to minimize thermal contact between the plug 111 and the helium to which it is exposed. In the example shown, the vacuum chamber 146 projecting into the further chamber 102 is a cylindrical canister that is adhesively bonded with its bottom surface concentrically on the smaller-diameter heat exchange surface 144 of the plug 111, and thus simultaneously forms a shoulder for the plug 111 to contact the plate 112. In order not to interfere with insertion of the plug 111 into the seat 116, the vacuum chamber 147 projecting into the first chamber 101 is conical in shape.

Figure 8B:
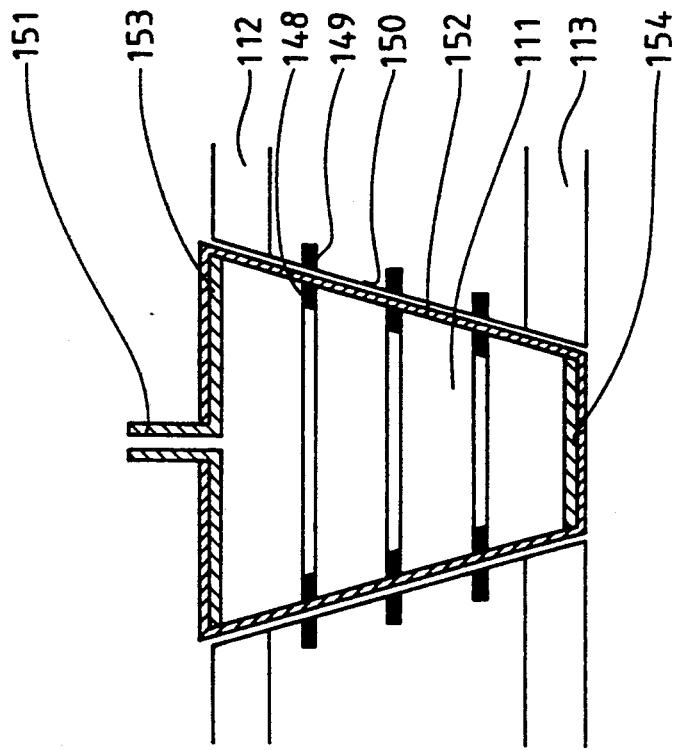
FIG. 8 shows a schematic vertical section through a hollow, evacuated plug
  a) without and
  b) with reinforcing rings on the inner walls of the plug and around the seating surface.
Figure 8A:
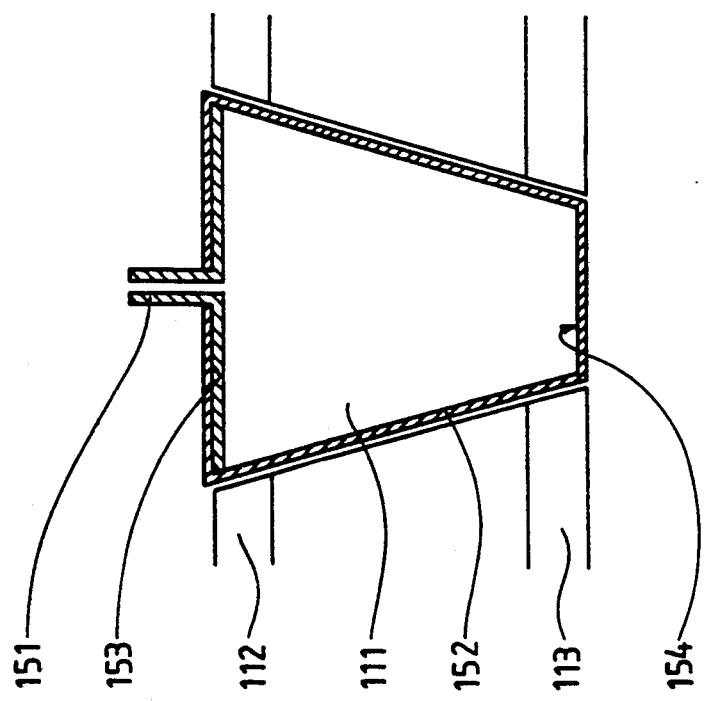

In a further variant shown in FIGS. 8a and 8b, the plug 111 is internally hollow and can be evacuated via a pumping nipple 151. In this manner, only the conical outer wall 152 now acts as a thermal bridge between the lower chamber 101 and upper chamber 102, since the horizontal thermal conduction of the upper and lower cover sections 153, 154 of the plug 111 is negligible compared with the thermal conduction of the helium flowing around them. The cover sections 153, 154 can therefore be relatively thick, which facilitates their mechanical production.

In the embodiment shown in FIG. 8b, reinforcing rings 148 are provided on the inner walls of the plug 111 in order to minimize the wall thickness of the outer wall 152. Reinforcing rings 149 that surround the vacuum-side outer surface 150 of the seat 116 similarly provide mechanical reinforcement of the seat 116, so that here again lesser wall thicknesses are sufficient, and the heat flow from the upper to the lower chamber is correspondingly reduced.

As a safety measure to prevent the risk of explosion, burst protection means, for example in the form of predetermined rupture points, are provided for all evacuated parts of the pressure relief valve that are exposed to helium, namely for the hollow embodiment of the plug 111 or for the vacuum chambers 146, 147; in the event of a pressure rise exceeding a few bars, these means open up a pressure equalization surface in the wall of the corresponding hollow element leading into the next environment, but on the other hand will withstand an external pressure of at least one bar.

The superconducting magnet coil 103 is energized with electrical current by means of electrical leads (not depicted), which are guided through the further chamber 102 before entering the first chamber 101 and are thus pre-cooled. After the superconducting magnet coil 103 is energized, the leads are removed and the superconducting magnet coil 103 is operated in superconducting short-circuit mode.

Nb₃Sn and Nb₃Sn with tantalum are envisaged as coil materials for the radial inner portion of the superconducting magnet coil 103 which generates particularly strong fields. Wound in series with the inner coil portion is an outer coil portion made of NbTi conductive elements, which generates a magnetic field of lesser field strength.

The arrows depicted in FIG. 4 are intended to indicate schematically the directions of heat flow in the cryostat 104, along with their associated calculated heat flow magnitudes. It is evident therefrom, in particular, that helium consumption for the NMR magnet system according to the invention is approximately 50 ml/hour=35 mW with a magnetic field of 17.6 T. In contrast to this, the arrangement cited earlier consumes 200 ml/hour of liquid helium to operate a magnet with a field strength of 11.7 T. If the design principle of this arrangement were retained and transferred to a magnet system with a field strength of 17.6 tesla, the cryostat design size that would then be required would yield a scaled-up consumption of approximately 600 ml/hour.

While the arrangement according to the invention is also perfectly suitable for use in chemical laboratories without a liquefier system, the known arrangement cited earlier is unsuitable for use as a standard unit, both because of its much more complex operation which requires highly trained personnel, and because of its significantly higher consumption of liquid helium.

This arrangement according to the invention thus represents an NMR magnet system that is easier to handle, more reliable in operation, and more economical in its consumption of cryogenic fluid, especially liquid helium, than a conventional supercooled system.

We claim:

1. NMR magnet system for generating a highly homogeneous magnetic field of high field strength that is highly stable over time, said NMR magnet system comprising: at least one superconducting magnet coil disposed in a first chamber of a cryostat in supercooled liquid helium at a temperature of less than 4.2K, said cryostat having at least one further chamber containing liquid helium at essentially atmospheric pressure with a temperature of approximately 4.2K, means connecting the first chamber to the further chamber in such a way that the supercooled liquid helium disposed in the first chamber is also essentially at atmospheric pressure, said first chamber and the at least one further chamber together constituting a divided tank, with the first chamber liquid helium being disposed below the further chamber and separated from the further chamber by a thermally insulating barrier, said barrier comprising a pressure relief valve to provide increased pressure equalization cross section in the barrier when the pressure differential between the first and the further chamber exceeds a certain value, said pressure relief valve comprising a plug with heat exchange surfaces facing into the chambers, said plug being inserted in a seat in the barrier, said NMR magnet system further comprising means, disposed for guiding the plug vertically without jamming, three towers arranged in a ring disposed on a top of the cryostat, means for distributing helium evaporating and/or pumped off from the cryostat to all the towers, said helium giving up its residual enthalpy to radiation shields disposed in the cryostat, and annular heat exchanger means, arranged in each tower in the form of a hollow tube, for evacuating helium evaporating and/or pumped out of the cryostat, said radiation shields being coupled in a thermally conductive manner to an outside of the annular heat exchanger.

2. NMR magnet system according to claim 1, further comprising refrigerator means for cooling a portion of the liquid helium to a temperature T less than 4.2K, said refrigerator means being disposed in the first chamber.

3. NMR magnet system according to claim 1, wherein the barrier consists of at least two plates that are essentially separated by a vacuum.

4. NMR magnet system according to claim 3, wherein the vacuum separating the plates is part of a combined vacuum section in the cryostat.

5. NMR magnet system according to claim 1, further comprising a restricted flow cross section disposed between the first and the further chamber for enabling liquid helium flow from the further chamber into the first chamber.

6. NMR magnet system according to claim 1, wherein the pressure relief valve consists of a plug formed from a material with poor thermal conductivity and inserted in a hole in the barrier.

7. NMR magnet system according to claim 1, wherein a vacuum chamber is provided on at least one of the heat exchange surfaces of the plug.

8. NMR magnet system according to claim 1, further comprising means for preventing the temperature, T, in the further chamber from dropping below 4.2K.

9. NMR magnet system according to claim 8, wherein the means for preventing the temperature in the further chamber from dropping comprises a heating element arranged in the further chamber.

10. NMR magnet system according to claim 8, further comprising a deflector radiation shield disposed in thermally conductive contact with the further chamber, and arranged at a distance around the first chamber.

11. NMR magnet system according to claim 1, wherein the first and the further chamber are suspended in the cryostat, and further comprising at least one radiation shield provided between the outer walls of the chambers and the outer walls of the cryostat.

12. NMR magnet system according to claim 1, wherein the first chamber is suspended from the further chamber by externally guided rods with poor thermal conductivity and good tensile strength.

13. NMR magnet system according to claim 12, wherein the rods connect the top cover of the further chamber to a plate that forms a top cover of the first chamber.

14. NMR magnet system according to claim 12, wherein the rods connect a top cover of the further chamber to a floor of the first chamber.

15. NMR magnet system according to claim 1, further comprising at least one tower, in which helium evaporating from the cryostat gives up its residual enthalpy to the radiation shields provided in the cryostat, disposed on the top of the cryostat.

16. NMR magnet system for generating a highly homogeneous magnetic field of high field strength that is highly stable over time, said NMR magnet system comprising: at least one superconducting magnet coil disposed in a first chamber of a cryostat in supercooled liquid helium at a temperature of less than 4.2K, said cryostat having at least one further chamber containing liquid helium at essentially atmospheric pressure with a temperature of approximately 4.2K, means connecting the first chamber to the further chamber in such a way that the supercooled liquid helium disposed in the first chamber is also essentially at atmospheric pressure, said first chamber and the at least one further chamber together constituting a divided tank, with the first chamber liquid helium being disposed below the further chamber and separated from the further chamber by a thermally insulating barrier, said barrier comprising a pressure relief valve to provide increased pressure equalization cross section in the barrier when the pressure differential between the first and the further chamber exceeds a certain value, said pressure relief valve comprising a plug with heat exchange surfaces facing into the chambers, said plug being inserted in a seat in the barrier, and a vacuum chamber is provided on at least one of the heat exchange surfaces of the plug, said NMR magnet system further comprising at least one guide rod means, disposed around the seat in the further chamber, for guiding the plug vertically without jamming, a vacuum chamber disposed on an upper heat exchange surface having a diameter greater than the upper heat exchange surface, another vacuum chamber disposed on a lower heat exchange surface of the plug, reinforcing rings disposed on inner walls of the plug, other reinforcing rings surrounding a surface of a seat facing away from the plug and is located in vacuum, three towers arranged in a ring disposed on a top of the cryostat, means for distributing helium evaporating and/or pumped off from the cryostat to all the towers, said helium giving up its residual enthalpy to radiation shields disposed in the cryostat, and annular heat exchanger means, arranged in each tower in the form of a hollow tube, for evacuating helium evaporating and/or pumped out of the cryostat, said radiation shields being coupled in a thermally conductive manner to an outside of the annular heat exchanger.

* * * * *